(12) United States Patent
Min et al.

(10) Patent No.: US 9,023,671 B2
(45) Date of Patent: May 5, 2015

(54) METHOD OF DISPOSING PHOSPHOR LAYERS

(71) Applicant: Lightizer Korea Co., Seoul (KR)

(72) Inventors: Jae Sik Min, Anyang (KR); Jae Young Jang, Anyang (KR); Jae Yeop Lee, Anyang (KR); Byoung Gu Cho, Anyang (KR)

(73) Assignee: Lightizer Korea Co., Seoul (KR)

( * ) Notice: Subject to any disclaimer, the term of this patent is extended or adjusted under 35 U.S.C. 154(b) by 0 days.

(21) Appl. No.: 14/166,946

(22) Filed: Jan. 29, 2014

(65) Prior Publication Data

US 2015/0093843 A1  Apr. 2, 2015

(30) Foreign Application Priority Data

Sep. 27, 2013  (KR) .......................... 10-2013-0114960

(51) Int. Cl.
   *H01L 21/00* (2006.01)
   *H01L 33/50* (2010.01)
(52) U.S. Cl.
   CPC ..................................... *H01L 33/50* (2013.01)

(58) Field of Classification Search
   None
   See application file for complete search history.

(56) References Cited

U.S. PATENT DOCUMENTS

2008/0290351 A1\* 11/2008 Ajiki et al. ...................... 257/88
2012/0052608 A1\*  3/2012 Yoo et al. ......................... 438/27
2013/0143339 A1\*  6/2013 Tischler et al. ................. 438/27

FOREIGN PATENT DOCUMENTS

| KR | 1020110051769 | 5/2011 |
| KR | 1020080070193 | 5/2012 |
| KR | 1020120019385 | 12/2012 |

\* cited by examiner

*Primary Examiner* — Angel Roman
(74) *Attorney, Agent, or Firm* — Keohane & D'Alessandro PLLC; Madeline F. Schiesser

(57) ABSTRACT

Disclosed herein is a method of disposing phosphor layers, which can prevent damage to phosphors and also effectively dispose phosphor layers at desired locations of Light-Emitting Diodes (LEDs) when the phosphor layers are detached and disposed at the top surfaces of the LEDs. According to an embodiment, phosphor layers fabricated by filling phosphor layer pattern holes within an area of the vertical frame with a phosphor solution are detached from the phosphor layer pattern holes by applying force downwardly or upwardly in a vertical manner.

14 Claims, 9 Drawing Sheets

METHOD OF DISPOSING PHOSPHOR LAYERS

CROSS REFERENCE TO RELATED APPLICATION

The present application claims the benefit of Korean Patent Application No. 10-2013-0114960 filed in the Korean Intellectual Property Office on Sep. 27, 2013, the entire contents of which are incorporated herein by reference.

BACKGROUND OF THE INVENTION

1. Technical Field

The present invention relates to a method of disposing phosphor layers and, more particularly, to a method of disposing phosphor layers, which can prevent damage to phosphor and also effectively dispose phosphor layers at desired locations of Light-Emitting Diodes (LEDs) when the phosphor layers are detached and disposed at the top surfaces of the LEDs.

2. Description of the Related Art

Recently, an LED in which aluminum (Al) or lanthanide (In) has been added to gallium nitride (GaN) has been in the spotlight due to a long lifespan, low power consumption, excellent brightness, and eco-friendly factors that are not harmful to the human body as compared with conventional incandescent bulbs. In particular, an LED chip that provides white light using phosphor layers has been further in the spotlight.

Such an LED is being used in automotive lightings, traffic lights, and the Back Light Unit (BLU) of a liquid crystal display due to the above advantages.

Recently, MacAdam's Ellipse Rule was proposed as an index for evaluating whether color coordinates measured in an artificial light source are identical with color coordinates when being seen by the human eye. MacAdam's Ellipse Rule provides a four-step criteria. In the United States, an artificial light source that does not comply with three steps of MacAdam's Ellipse rule is not allowed to be sold. In order to satisfy the three steps of MacAdam's Ellipse rule, it is very important to reduce a color deviation of white light. Korean Patent Laid-Open Publication No. 10-2008-0070193 discloses a phosphor film in which a phosphor is formed on a surface of a film made of resin. In order to dispose the phosphor film at the top surface of an LED, a process of detaching or taking the phosphor film is necessary. If the phosphor film is detached or taken, it is very difficult to reduce a color deviation of white light because the phosphor is damaged or is not effectively disposed at the top surface of the LED due to electrostatic force or adhesive force between the phosphor and the film made of resin.

SUMMARY OF THE INVENTION

Accordingly, the present invention has been developed keeping in mind the above problems occurring in the prior art, and an object of the present invention is to provide a method of disposing phosphor layers, which can prevent damage to phosphors and also effectively dispose phosphor layers at desired locations of LEDs when the phosphor layers are detached and disposed at the top surfaces of the LEDs.

Technical objects to be achieved by the present invention are not limited to the aforementioned object, and other technical objects that have not been described above will become evident to those skilled in the art to which the present invention pertains from the following description.

In order to achieve the above object, a method of disposing phosphor layers in accordance with an embodiment of the present invention includes preparing phosphor layer fabrication equipment including a vertical frame and a plurality of phosphor layer pattern holes vertically formed to have respective phosphor layer pattern shapes in the vertical frame within an area of the vertical frame; fabricating phosphor layers by filling the plurality of phosphor layer pattern holes of the phosphor layer fabrication equipment with a phosphor layer solution including a phosphor, silicon, and a filler and baking the filled phosphor layer solution; placing an LED under the phosphor present in each of the plurality of phosphor layer pattern holes of the phosphor layer fabrication equipment in such a way as to be spaced apart from the phosphor; and vertically applying force to the phosphor present in the phosphor layer pattern hole from a top to a bottom of the phosphor so that the phosphor is detached from the phosphor layer pattern hole downwardly and vertically and placed at the top surface of the LED.

In the method of disposing phosphor layers in accordance with an embodiment of the present invention, in the disposing of the phosphor at the top surface of the LED, the force vertically applied to the phosphor present in the phosphor layer pattern hole from the top to the bottom of the phosphor may be transferred by an object having a flat bottom.

A method of disposing phosphor layers in accordance with another embodiment of the present invention includes preparing phosphor layer fabrication equipment including a vertical frame and a plurality of phosphor layer pattern holes vertically formed to have respective phosphor layer pattern shapes in the vertical frame within an area of the vertical frame; fabricating phosphor layers by filling the plurality of phosphor layer pattern holes of the phosphor layer fabrication equipment with a phosphor layer solution including a phosphor, silicon, and a filler and baking the filled phosphor layer solution; placing an upward guider under the phosphor present in each of the plurality of phosphor layer pattern holes of the phosphor layer fabrication equipment in such a way as to be spaced from the phosphor and placing a vacuum chuck over the phosphor present in the phosphor layer pattern hole in such a way as to be spaced from the phosphor; vertically applying force to the phosphor present in the phosphor layer pattern hole from a bottom to a top of the phosphor using the upward guider so that the phosphor is detached from the phosphor layer pattern hole upwardly and vertically and then placed at a bottom of the vacuum chuck; maintaining the vacuum chuck at a specific pressure or lower (e.g., a pressure from a range of approximately 10 torr to 700 torr) so that the phosphor present at the bottom of the vacuum chuck is adsorbed by the bottom of the vacuum chuck; and moving the phosphor present at the bottom of the vacuum chuck and placing the phosphor at the top surface of an LED.

In the method of disposing phosphor layers in accordance with another embodiment of the present invention, the upward guider may have a flat top surface.

Figure 1:
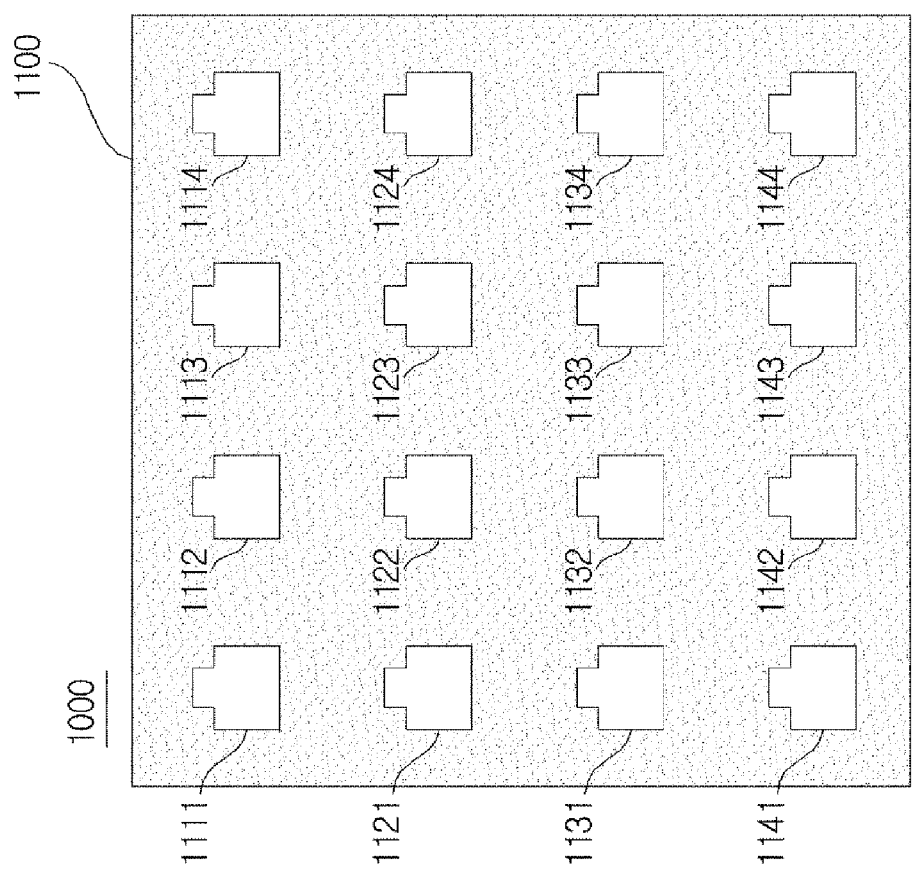
FIG. 1 is a plan view of phosphor layer fabrication equipment that is used in methods for disposing phosphor layers in accordance with embodiments of the present invention.

The following is a description of reference numerals of principal elements in the drawings:

1000: phosphor layer fabrication equipment
1100: vertical frame
1200: downward guider
1300, 2300: LED
2200: upward guider
2400: vacuum chuck
11 to 14, 21 to 24, 31 to 34, 41 to 44: phosphor layer
1111 to 1114, 1121 to 1124, 1131 to 1134, 1141 to 1144: phosphor layer pattern hole

DETAILED DESCRIPTION

Hereinafter, some exemplary embodiments of the present invention are described in detail with reference to the accompanying drawings.

Figure 2:
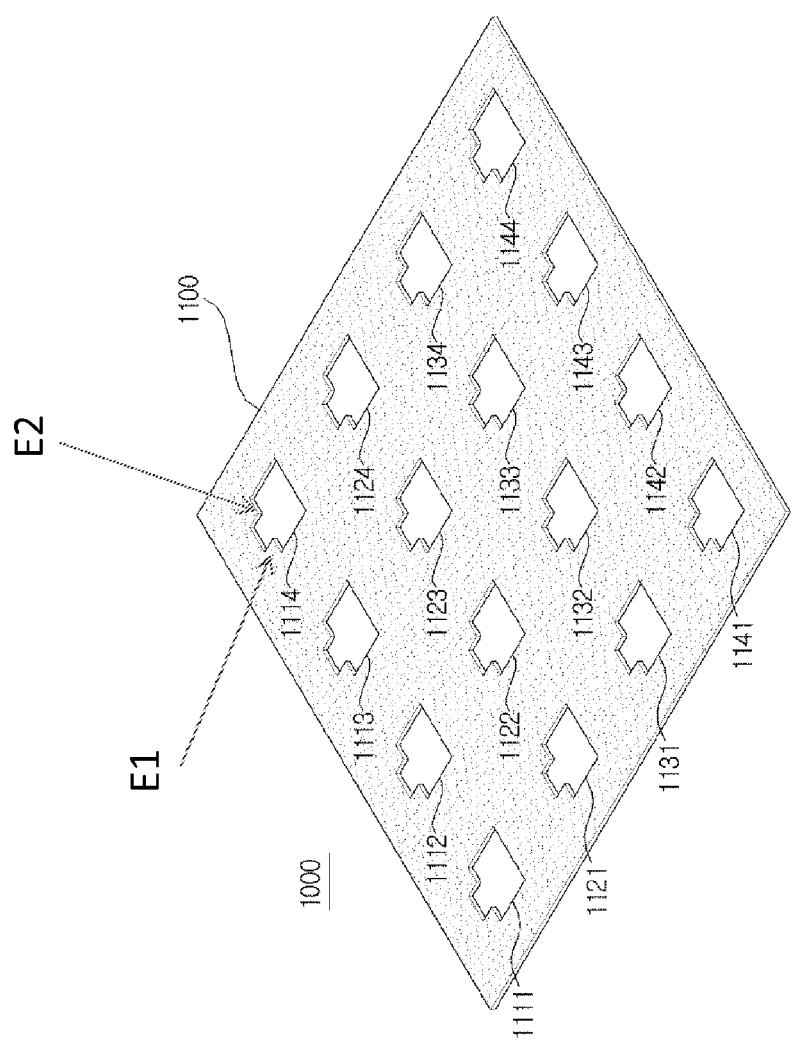
FIG. 2 is a perspective view of phosphor layer fabrication equipment that is used in methods for disposing phosphor layers in accordance with embodiments of the present invention.

Phosphor layer fabrication equipment 1000 used in methods for disposing phosphor layers in accordance with embodiments of the present invention, as shown in FIGS. 1 and 2, may include a vertical frame 1100 and a plurality of phosphor layer pattern hole 1111 to 1114, 1121 to 1124, 1131 to 1134, and 1141 to 1144 vertically formed to have respective phosphor layer pattern shapes in the vertical frame 1100 within a specific area of the vertical frame 1100.

The plurality of phosphor layer pattern hole 1111 to 1114, 1121 to 1124, 1131 to 1134, and 1141 to 1144 can each include at least one respective pad electrode shape. More particularly, as shown in FIGS. 1 and 2, rectangular pad electrode shapes are formed at the upper left and upper right locations of each of the plurality of phosphor layer pattern hole 1111 to 1114, 1121 to 1124, 1131 to 1134, and 1141 to 1144. Examples of the pad electrode shapes are pointed out at E1 and E2 in FIGS. 2 and 3. If phosphor layers are fabricated by filling the plurality of phosphor layer pattern hole 1111 to 1114, 1121 to 1124, 1131 to 1134, and 1141 to 1144 with a phosphor solution, pad electrodes can be disposed at the upper left and upper right locations of the phosphor layers.

The pad electrode shapes do not need to be necessarily included at the upper left and upper right locations of the plurality of phosphor layer pattern hole 1111 to 1114, 1121 to 1124, 1131 to 1134, and 1141 to 1144, as shown in FIGS. 1 and 2. In some embodiments, the pad electrode shapes may be included at various locations, such as upper center, lower left, upper left, lower center, lower right, upper right, locations, and any other suitable location of the plurality of phosphor layer pattern holes, if necessary.

Furthermore, pad electrodes are not limited to a rectangular shape, but instead can be a circle, a triangle, a pentagon, an arc, and and/or any other suitable shape.

The vertical frame 1100 can be made of non-transparent materials that do not transmit light. More particularly, the vertical frame 1100 can be made of non-transparent metal materials, such as aluminum or stainless steel, or other non-transparent insulating materials, such as, without limitation, silicon or silicon oxide. If the vertical frame 1100 is made of non-transparent materials that do not transmit light as described above, the phosphor layers dried in the phosphor layer pattern hole 1111 to 1114, 1121 to 1124, 1131 to 1134, and 1141 to 1144 can be located at the top surface of an LED, and from there (without need for any movements or changes therefrom), a test to be described later can be effectively performed. This is because the vertical frame 1100 does not transmit light emitted from the LED. Instead, only the phosphor layers transmit the light emitted from the LED when the characteristics of light passing through the phosphor layer are tested by passing the light emitted from the LED through the phosphor layer.

The phosphor layers can be fabricated by filling the plurality of phosphor layer pattern hole 1111 to 1114, 1121 to 1124, 1131 to 1134, and 1141 to 1144 with a phosphor solution having viscosity of about 1,000 centipoise (cP) to 300,000 cP. If the phosphor solution having the above-described viscosity is used, the yield of the phosphor layers can be stably maintained because the phosphor solution can be effectively maintained in the plurality of phosphor layer pattern hole 1111 to 1114, 1121 to 1124, 1131 to 1134, and 1141 to 1144.

A method of fabricating phosphor layers using the phosphor layer fabrication equipment used in methods of disposing phosphor layers in accordance with embodiments of the present invention is described below.

First, the plurality of phosphor layer pattern hole 1111 to 1114, 1121 to 1124, 1131 to 1134, and 1141 to 1144 is filled with a phosphor solution that includes a phosphor (for transforming light emitted from an LED into white light by varying a wavelength of the light of the LED), silicon, and a filler.

The top and bottom of the vertical frame 1100 (having the phosphor layer pattern holes filled with the phosphor) solution are polished.

Figure 3:
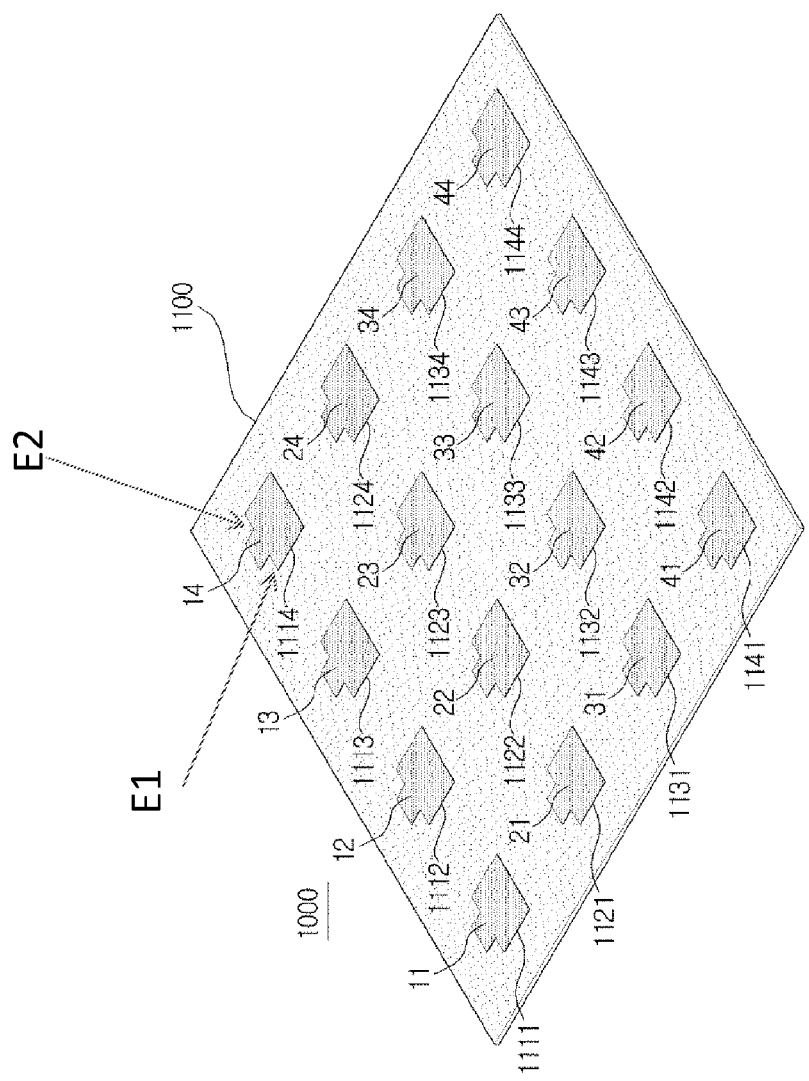
FIG. 3 is a perspective view showing that phosphor layers has been fabricated in the phosphor layer fabrication equipment of FIG. 2.

Next, the vertical frame 1100 (having the phosphor layer pattern holes filled with the phosphor solution) is dried/baked at a temperature of 50° C. (degrees Celsius) to 200° C. for about 5 minutes to 100 minutes to bake the phosphor layer in the plurality of phosphor layer pattern holes. As a result, as shown in FIG. 3, phosphor layers 11 to 14, 21 to 24, 31 to 34, and 41 to 44 are located in the respective phosphor layer pattern hole 1111 to 1114, 1121 to 1124, 1131 to 1134, and 1141 to 1144.

As a result of the baking, the phosphor layers 11 to 14, 21 to 24, 31 to 34, and 41 to 44 become baked (i.e. dried) in the phosphor layer pattern hole 1111 to 1114, 1121 to 1124, 1131 to 1134, and 1141 to 1144. The characteristics of light emitted from the LED that passes through the phosphor layers 11 to 14, 21 to 24, 31 to 34, and 41 to 44 are tested by passing the light of the LED through the phosphor layers.

A method of disposing phosphor layers in accordance with an embodiment of the present invention is described below.

First, the phosphor layer fabrication equipment 1000, including the vertical frame 1100 and a plurality of phosphor layer pattern hole 1111 to 1114, 1121 to 1124, 1131 to 1134, and 1141 to 1144 vertically formed to have respective pad electrode shapes (like as described above) in the vertical frame within a specific area of the vertical frame as described above, is prepared.

Phosphor layers 11 to 14, 21 to 24, 31 to 34, and 41 to 44 are fabricated by filling the plurality of phosphor layer pattern hole 1111 to 1114, 1121 to 1124, 1131 to 1134, and 1141 to 1144 of the phosphor layer fabrication equipment 1000 with the phosphor layer solution including a phosphor, silicon, and a filler, and then baking the filled phosphor layer solution as described above.

Figure 4A:
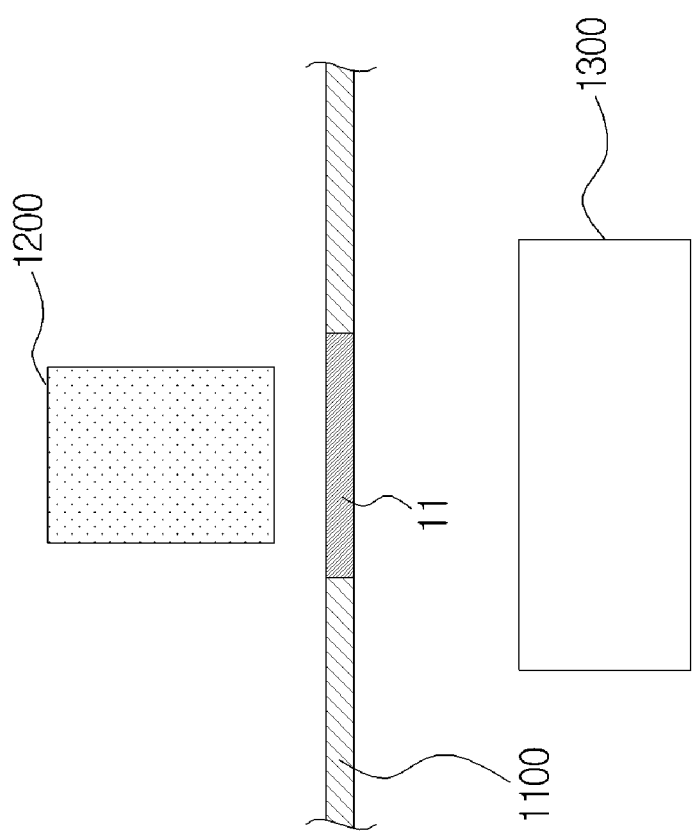
FIGS. 4A and 4B are cross-sectional views illustrating detailed steps of a method of disposing phosphor layers in accordance with an embodiment of the present invention.

As shown in FIG. 4A, an LED 1300 is placed in such a way as to be spaced apart from a phosphor 11 to 14, 21 to 24, 31 to 34, and 41 to 44 that is present in any of the plurality of phosphor layer pattern hole 1111 to 1114, 1121 to 1124, 1131 to 1134, and 1141 to 1144 of the phosphor layer fabrication equipment 1000. In this example, phosphor 11 and phosphor layer pattern hole 1111 are used/shown.

Figure 4B:
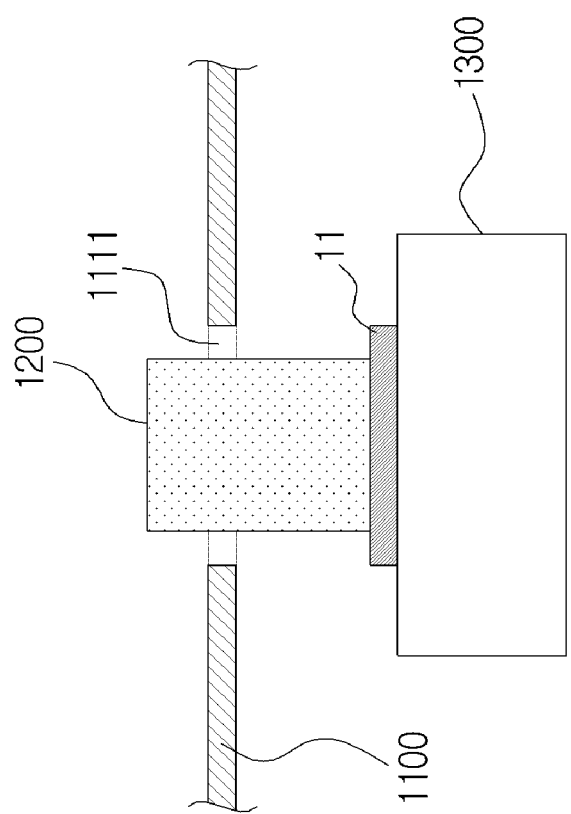

As shown in FIG. 4B, force is vertically applied to the phosphor 11 that is present in the phosphor layer pattern hole 1111 from the top towards the bottom of the phosphor 11. As a result, the phosphor 11 is detached from the phosphor layer pattern hole 1111 downwardly and vertically and is then disposed at the top surface of the LED 1300. The force that is vertically applied to the phosphor 11 present in the phosphor layer pattern hole 1111 from the top towards the bottom of the phosphor 11 can be transferred by a downward guider 1200 having a flat bottom.

A method of disposing phosphor layers in accordance with another embodiment of the present invention is described below.

First, the phosphor layer fabrication equipment 1000, including the vertical frame 1100 and a plurality of phosphor layer pattern hole 1111 to 1114, 1121 to 1124, 1131 to 1134, and 1141 to 1144 vertically formed to have respective phosphor layer pattern shapes in the vertical frame 1100 within anarea of the vertical frame as described above, is prepared.

Phosphor layers 11 to 14, 21 to 24, 31 to 34, and 41 to 44 are fabricated by filling the plurality of phosphor layer pattern hole 1111 to 1114, 1121 to 1124, 1131 to 1134, and 1141 to 1144 of the phosphor layer fabrication equipment 1000 with the phosphor layer solution including a phosphor, silicon, and a filler, and then baking the filled phosphor layer solution, as described above.

Figure 5A:
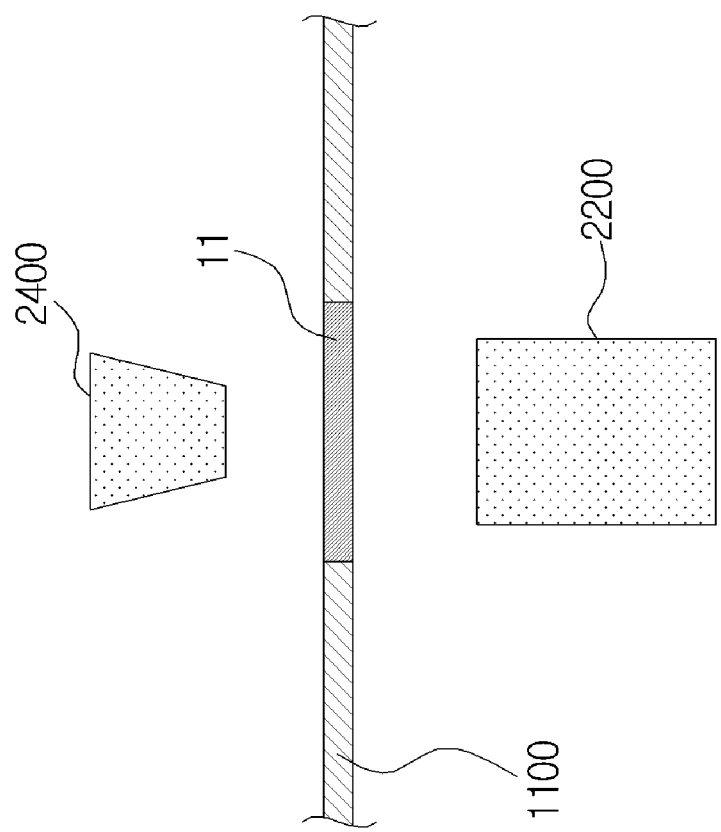
FIGS. 5A to 5D are cross-sectional views illustrating detailed steps of a method of disposing phosphor layers in accordance with another embodiment of the present invention.

As shown in FIG. 5A, an upward guider 2200 is placed under a phosphor 11 to 14, 21 to 24, 31 to 34, and 41 to 44 that is present in any of the plurality of phosphor layer pattern hole 1111 to 1114, 1121 to 1124, 1131 to 1134, and 1141 to 1144 of the phosphor layer fabrication equipment 1000. In this example, phosphor 11 and phosphor layer pattern hole 1111 are used/shown. A vacuum chuck 2400 is placed over the phosphor 11 present in the phosphor layer pattern hole 1111.

Figure 5B:
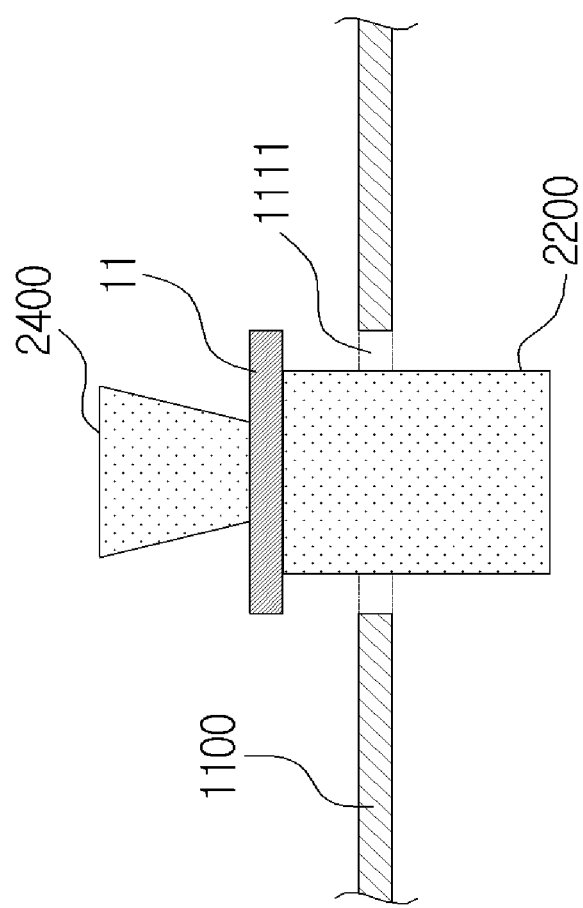

As shown in FIG. 5B, the upward guider 2200 applies force to the phosphor 11 present in the phosphor layer pattern hole 1111 in a vertical direction from the bottom towards the top of the phosphor 11. As a result, the phosphor 11 is detached from the phosphor layer pattern hole 1111 upwardly and vertically, and is then placed at the bottom surface of the vacuum chuck 2400. The upward guider 2200 can have a flat top surface.

Figure 5C:
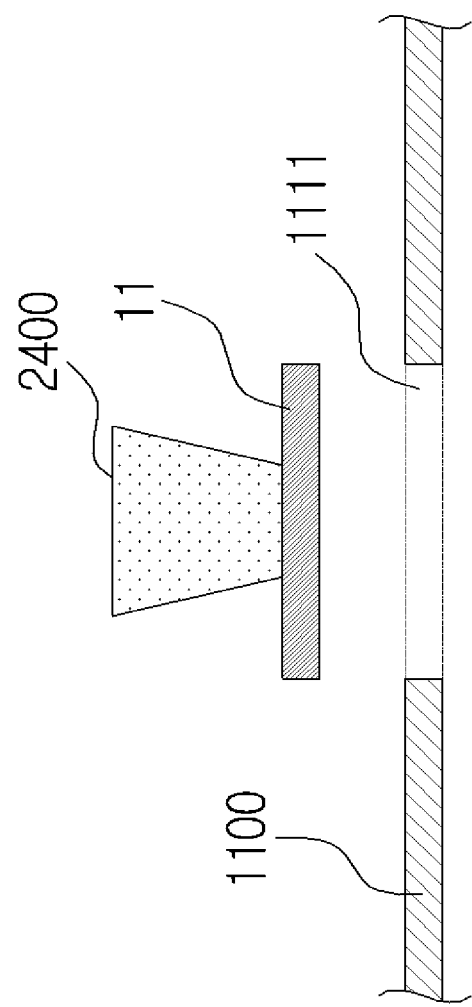

As shown in FIG. 5C, the phosphor 11 placed at the bottom surface of the vacuum chuck 2400 is adsorbed by the bottom surface of the vacuum chuck 2400 because the vacuum chuck 2400 maintains a specific pressure or lower. Such specific pressure may be, for example, without limitation, in a range of approximately 10 torr to 700 torr.

Figure 5D:
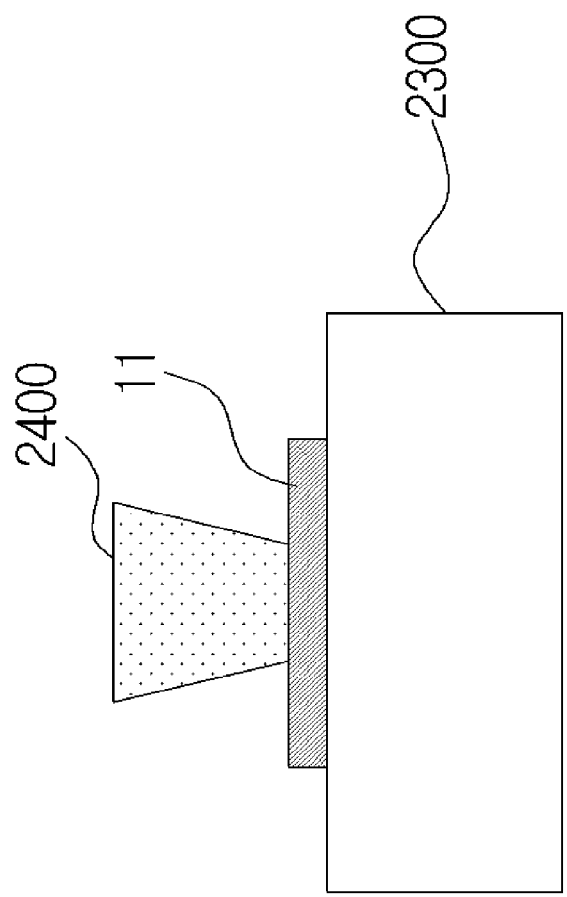

As shown in FIG. 5D, the phosphor 11 adsorbed by the bottom surface of the vacuum chuck 2400 is moved and placed at the top surface of an LED 2300.

In the methods of disposing phosphor layers in accordance with embodiments of the present invention, rather than a phosphor being formed on a surface of a film made of resin, phosphor layers are fabricated by filling phosphor layer pattern holes within an area of the vertical frame with a phosphor solution. After baking, in an embodiment, the phosphor layers are detached from the phosphor layer pattern holes by applying force downwardly and vertically. In another embodiment, the phosphor layers are detached from the vertical frame by applying force upwardly and vertically and are then adsorbed using the vacuum chuck. Accordingly, in embodiments, each phosphor layer can be disposed at a desired location of the top surface of an LED without damaging the phosphor because electrostatic force or adhesive force occurring between the phosphor and the film made of resin can be effectively prevented.

Although the present invention has been described in connection with the preferred embodiments for illustrating the principle of the present invention, the present invention is not limited to the aforementioned constitutions and actions. A person having ordinary skill in the art will appreciate that the present invention can be changed and modified in various manners without departing from the spirit and scope of the present invention.

Accordingly, all proper changes, modifications, and equivalents should be construed as belonging to the scope of the present invention.

What is claimed is:

1. A method of disposing phosphor layers, comprising:
   preparing phosphor layer fabrication equipment comprising a vertical frame and a plurality of phosphor layer pattern holes;
   fabricating phosphor layers by filling the plurality of phosphor layer pattern holes of the phosphor layer fabrication equipment with a phosphor layer solution comprising a phosphor, silicon, and a filler and baking the filled phosphor layer solution;
   placing a Light-Emitting Diode (LED) under the phosphor present in each of the plurality of phosphor layer pattern holes of the phosphor layer fabrication equipment in such a way as to be spaced apart from the phosphor; and
   vertically applying force to the phosphor present in the phosphor layer pattern hole from a top towards a bottom of the phosphor so that the phosphor is detached from the phosphor layer pattern hole downwardly and vertically and placed at a top surface of the LED.

2. The method of claim 1, wherein in the disposing of the phosphor at the top surface of the LED, the force vertically applied to the phosphor present in the phosphor layer pattern hole from the top towards the bottom of the phosphor is transferred by an object having a flat bottom.

3. The method of claim 1, wherein the phosphor layer pattern holes are vertically formed in the vertical frame within a specific area of the vertical frame.

4. The method of claim 1, wherein the plurality of phosphor layer pattern holes each comprise pad electrodes of a shape comprising at least one of a rectangle, circle, a triangle, a pentagon, or another shape.

5. The method of claim 4, wherein the pad electrodes may be located at an upper center, lower left, lower center, lower right, and any other suitable location of each of the plurality of phosphor layer pattern holes.

6. The method of claim 1, wherein the baking is at a temperature in a range of about 50° C. to 200° C. for about 5 minutes to 100 minutes.

7. The method of claim 1, wherein the pressure is about 10 torr to 700 torr.

8. A method of disposing phosphor layers, comprising:
   preparing phosphor layer fabrication equipment comprising a vertical frame and a plurality of phosphor layer pattern holes;
   fabricating phosphor layers by filling the plurality of phosphor layer pattern holes of the phosphor layer fabrication equipment with a phosphor layer solution comprising a phosphor, silicon, and a filler and baking the filled phosphor layer solution;
   placing an upward guider under the phosphor present in each of the plurality of phosphor layer pattern holes of the phosphor layer fabrication equipment in such a way as to be spaced from the phosphor and placing a vacuum chuck over the phosphor present in the phosphor layer pattern hole in such a way as to be spaced from the phosphor;

vertically applying force to the phosphor present in the phosphor layer pattern hole from a bottom towards a top of the phosphor using the upward guider so that the phosphor is detached from the phosphor layer pattern hole upwardly and vertically and then placed at a bottom of the vacuum chuck;

maintaining the vacuum chuck at specific pressure or lower so that the phosphor present at the bottom of the vacuum chuck is adsorbed by the bottom of the vacuum chuck; and moving the phosphor present at the bottom of the vacuum chuck and placing the phosphor at a top surface of an LED.

9. The method of claim 8, wherein the upward guider has a flat top surface.

10. The method of claim 8, wherein the phosphor layer pattern holes are vertically formed in the vertical frame within a specific area of the vertical frame.

11. The method of claim 8, wherein the plurality of phosphor layer pattern holes each comprise pad electrodes of a shape comprising at least one of a rectangle, circle, a triangle, a pentagon, or another shape.

12. The method of claim 11, wherein the pad electrodes may be located at an upper center, lower left, lower center, lower right, and any other suitable location of each of the plurality of phosphor layer pattern holes.

13. The method of claim 1, wherein the baking is at a temperature in a range of about 50° C. to 200° C. for about 5 minutes to 100 minutes.

14. The method of claim 1, wherein the pressure is about 10 torr to 700 torr.

* * * * *